United States Patent
Damodaran et al.

(10) Patent No.: US 9,575,901 B2
(45) Date of Patent: *Feb. 21, 2017

(54) PROGRAMMABLE ADDRESS-BASED WRITE-THROUGH CACHE CONTROL

(71) Applicant: Texas Instruments Incorporated, Dallas, TX (US)

(72) Inventors: Raguram Damodaran, Plano, TX (US); Abhijeet Ashok Chachad, Plano, TX (US); Naveen Bhoria, Plano, TX (US); David Matthew Thompson, Irving, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/884,138

(22) Filed: Oct. 15, 2015

(65) Prior Publication Data
US 2016/0034396 A1 Feb. 4, 2016

Related U.S. Application Data

(62) Division of application No. 13/247,234, filed on Sep. 28, 2011, now Pat. No. 9,189,331.

(Continued)

(51) Int. Cl.
*G06F 12/00* (2006.01)
*G06F 13/00* (2006.01)
(Continued)

(52) U.S. Cl.
CPC ......... *G06F 12/1081* (2013.01); *G06F 1/3296* (2013.01); *G06F 7/483* (2013.01); *G06F 9/3012* (2013.01); *G06F 11/1064* (2013.01); *G06F 12/0246* (2013.01); *G06F 12/0811* (2013.01); *G06F 12/0815* (2013.01); *G06F 12/12* (2013.01); *G06F 13/1605* (2013.01); *G06F 13/18* (2013.01); *H03K 19/0016* (2013.01); *H03K 21/00* (2013.01); *H03M 13/2903* (2013.01); *H03M 13/353* (2013.01); *G06F 13/1652* (2013.01); *G06F 13/1657* (2013.01); *G06F 13/1663* (2013.01);
(Continued)

(58) Field of Classification Search
CPC ............. G06F 12/0811; G06F 12/0815; G06F 12/0871
USPC ................................ 711/122, 142, 143, 144
See application file for complete search history.

(56) References Cited

U.S. PATENT DOCUMENTS

| | | | |
|---|---|---|---|
| 2003/0056062 A1* | 3/2003 | Prabhu | G06F 12/0804 711/143 |
| 2003/0061531 A1* | 3/2003 | Fletcher | G06F 9/4401 714/6.32 |
| 2006/0123184 A1* | 6/2006 | Mondal | G06F 9/3016 711/6 |

* cited by examiner

*Primary Examiner* — Charles Rones
*Assistant Examiner* — Sidney Li
(74) *Attorney, Agent, or Firm* — Robert D. Marshall, Jr.; Charles A. Brill; Frank D. Cimino

(57) ABSTRACT

This invention is a cache system with a memory attribute register having plural entries. Each entry stores a write-through or a write-back indication for a corresponding memory address range. On a write to cached data the cache the cache consults the memory attribute register for the corresponding address range. Writes to addresses in regions marked as write-through always update all levels of the memory hierarchy. Writes to addresses in regions marked as write-back update only the first cache level that can service the write. The memory attribute register is preferably a memory mapped control register writable by the central processing unit.

3 Claims, 5 Drawing Sheets

Related U.S. Application Data

(60) Provisional application No. 61/387,283, filed on Sep. 28, 2010.

(51) Int. Cl.
*G06F 13/28* (2006.01)
*G06F 12/10* (2016.01)
*G06F 7/483* (2006.01)
*G06F 9/30* (2006.01)
*H03M 13/35* (2006.01)
*H03M 13/29* (2006.01)
*G06F 11/10* (2006.01)
*G06F 13/16* (2006.01)
*G06F 13/18* (2006.01)
*H03K 19/00* (2006.01)
*G06F 1/32* (2006.01)
*H03K 21/00* (2006.01)
*G06F 12/02* (2006.01)
*G06F 12/12* (2016.01)
*G06F 12/08* (2016.01)
*G06F 13/364* (2006.01)

(52) U.S. Cl.
CPC .... *G06F 13/364* (2013.01); *G06F 2212/1021* (2013.01); *G06F 2212/1032* (2013.01); *G06F 2212/221* (2013.01); *G06F 2212/2532* (2013.01); *G06F 2212/283* (2013.01); *G06F 2212/608* (2013.01); *G06F 2212/69* (2013.01); *Y02B 60/1214* (2013.01); *Y02B 60/1285* (2013.01); *Y02B 60/32* (2013.01)

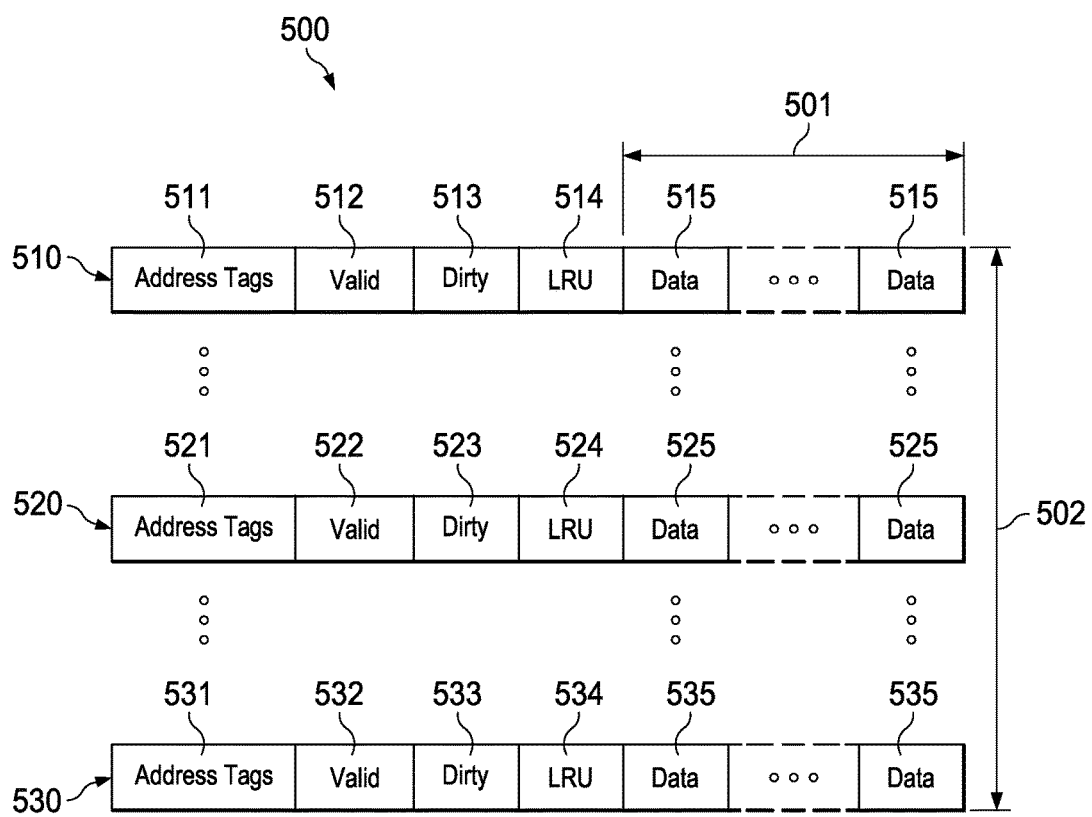

PROGRAMMABLE ADDRESS-BASED WRITE-THROUGH CACHE CONTROL

CLAIM OF PRIORITY

This application is a divisional of U.S. patent application Ser. No. 13/247,234 filed Sep. 28, 2011 which claims priority under 35 U.S.C. 119(e)(1) to U.S. Provisional Application No. 61/387,283 filed Sep. 28, 2010.

TECHNICAL FIELD OF THE INVENTION

The technical field of this invention is cache for digital data processors.

BACKGROUND OF THE INVENTION

The following is a description of information regarding cache design. A multi-level cache hierarchy may be inclusion or exclusion. In an inclusive cache hierarchy data stored at lower levels of the cache are present at all higher levels of the cache hierarchy. In an exclusive cache hierarchy data can only be stored at one level of the hierarchy. In a non-exclusive cache hierarchy is neither strictly inclusive nor strictly exclusive. Thus data stored at lower levels of the cache may be stored at higher levels of the cache but need not be.

When a write access occurs to an address stored in a lower level cache, the data in that cache is modified and the status bits for that cache line are updated to reflect the fact that the data has been modified. This is called the line is dirty. This concept is only relevant to a cache that implements a write-back policy. There are two primary cache writing policies called write-back and write-through.

Most cache implementations utilize a write-back policy. Under a write-back policy, when a write access occurs to a given address the write takes place in the lowest level of the cache hierarchy that can service the write. Higher level caches are not modified. If the data is stored in multiple levels of the hierarchy, the data at the lowest level of the hierarchy that actually serviced the write access becomes the current data for that address. The data at the higher levels of the hierarchy becomes stale because it holds the old value. Under the write-back policy, when a cache at a lower level of the hierarchy evicts a data line that is dirty, the data of the dirty line is written back to higher levels of the hierarchy. There are two problems associated with a write-back cache hierarchy: coherence and delayed updates.

The write-back cache coherence problem is a follows. For inclusive and non-exclusive caches, the same data line can be present at multiple levels of the hierarchy. When a write access to the lowest level of the hierarchy makes a cache line dirty, the data at higher levels becomes outdated. This is a problem if the higher levels of the hierarchy can be accessed directly without first accessing the lower levels of the hierarchy. This problem also exists in a more generalized model, where the highest level of the cache hierarchy is RAM storage rather than a cache. If the cached data at a lower level of the hierarchy has a dirty copy of the data in the RAM, and the system allows direct access to the RAM, the most up-to-date data must be returned. If this is not done the memory consistency guarantees for the system is violated. If the memory system provides a coherency guarantee, then the various levels of the cache hierarchy must remain coherent with each other. Thus each level of the cache hierarchy must have visibility into the other levels of the hierarchy in order to always have access to the most up-to-date version of the data.

The write-back cache delayed update problem is a follows. According to the write-back cache policy writes are not reflected to higher levels of the cache hierarchy until the lowest level cache line that contains modified data is evicted. At that time the next level is updated and marked dirty. The update then stops until the line at this level of the hierarchy is evicted and written back, and so on. In a system that provides no coherency guarantee for this data, independent accesses to the higher levels of the hierarchy will continue to sample stale data for an indefinite amount of time until the updates propagate through to the higher levels of the hierarchy.

A less common cache policy is known as write-through. Under this policy when a write occurs to a given address, the lowest level of the cache hierarchy that can service the write access will both service the write and forward the write to the next level of the hierarchy. The next level will also service the write and forward it. Each level of the hierarchy will do likewise. In a write-through hierarchy, a write that hits a line in the cache does not need to mark the line dirty, because the write data will be forwarded to all levels of the hierarchy. Thus all levels of the hierarchy will remain current with respect to the data that was written.

The main problem with a write-through cache is the increased memory traffic associated with forwarding all write accesses throughout the hierarchy. Whereas a write-back cache can act as a filter between levels of the hierarchy, a write-through cache does not filter writes.

SUMMARY OF THE INVENTION

This invention is a cache system with a memory attribute register having plural entries. Each entry stores a write-through or a write-back indication for a corresponding memory address range. On a write to cached data the cache consults the memory attribute register for the corresponding address range. Writes to addresses in regions marked as write-through always update all levels of the memory hierarchy. Writes to addresses in regions marked as write-back update only the first cache level that can service the write. The memory attribute register is preferably a memory mapped control register writable by the central processing unit.

The write enable bit of each entry of said memory attribute register is located in a first level cache. This indication is communicated to other levels of memory hierarchy.

A second level memory includes cache and directly addressable local memory. The entry of the memory attribute register for addresses in the local memory is fixed as write-back.

BRIEF DESCRIPTION OF THE DRAWINGS

These and other aspects of this invention are illustrated in the drawings, in which:

FIG. 4 illustrates the instruction syntax of the very long instruction word digital signal processor core illustrated in FIG. 2 (prior art);

FIG. 5 illustrates the details of a set of typical prior art cache lines (prior art);

DETAILED DESCRIPTION OF PREFERRED EMBODIMENTS

Figure 1:
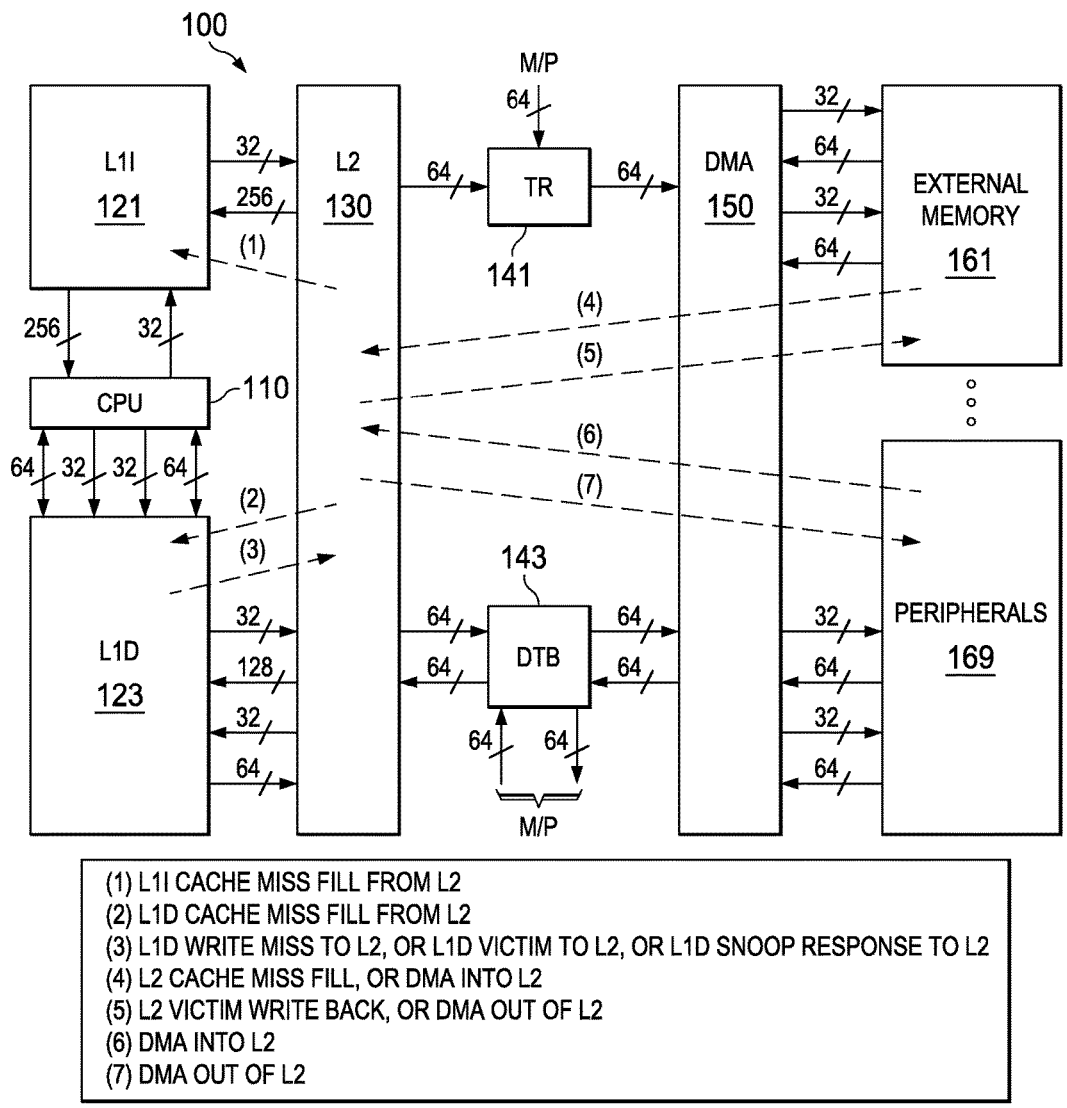
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
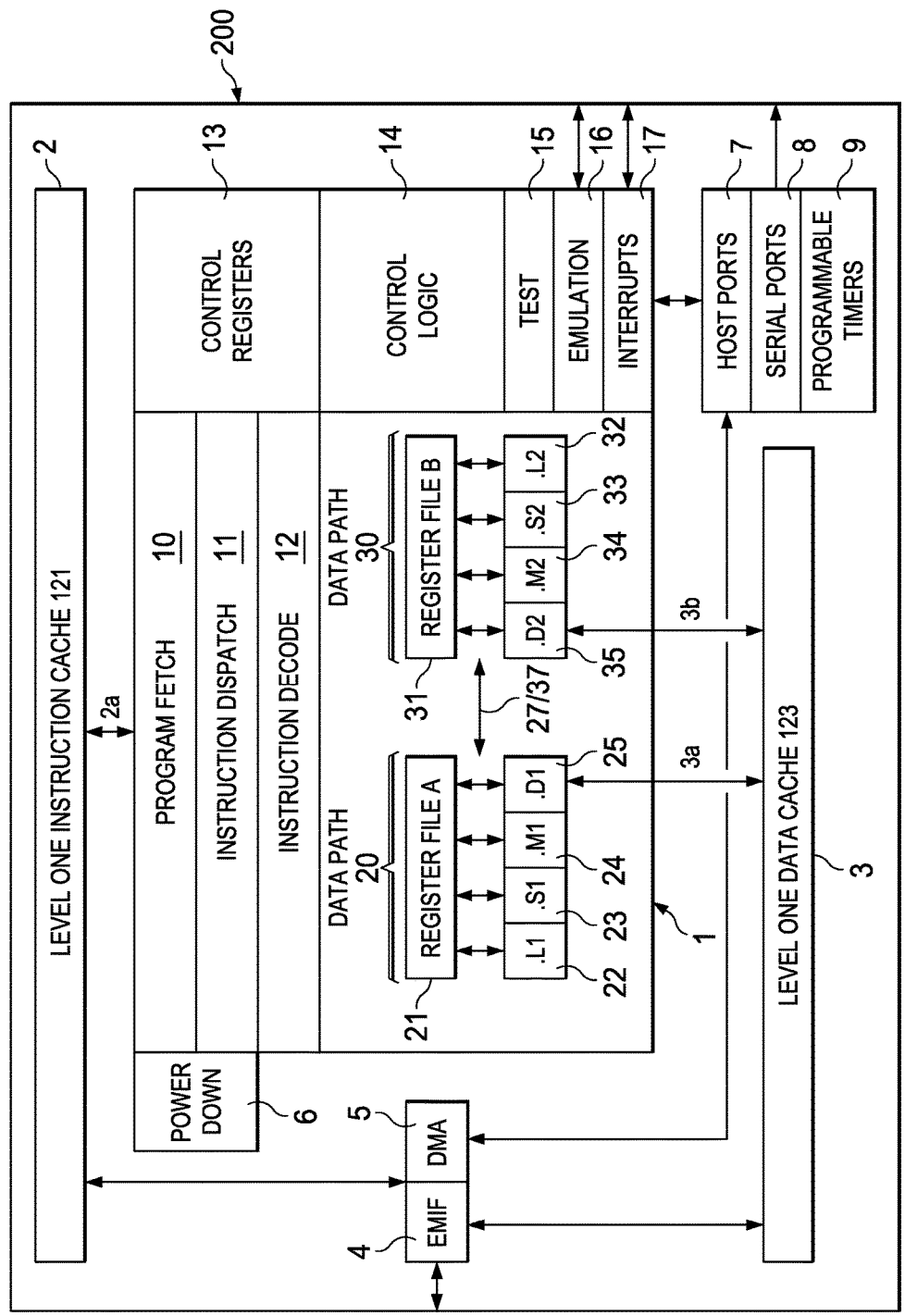
FIG. 2 illustrates details of a very long instruction word digital signal processor core suitable for use in Figure (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
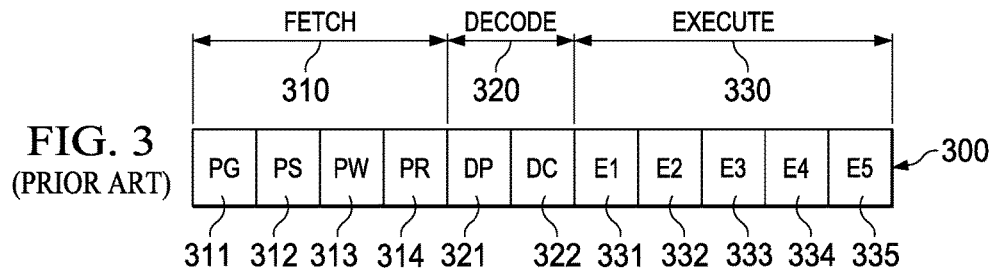
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional Register | creg | | | z |
|---|---|---|---|---|
|  | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

FIG. 5 illustrates the details of plural cache lines such as used in L1I cache 121, L1D cache 123 and L2 cache 131 illustrated in FIG. 1. Cache 500 illustrated in FIG. 5 includes cache lines 510, 520 and 520 are representative of the internal structure of cache 500. Each of cache lines 510, 520 and 530 includes: respective address tags 511, 521 and 522; respective valid bits 512, 522 and 523; respective dirty bits 513, 523 and 533; respective least recently used (LRU) indicators 514, 524 and 534; and respective data words 515, 525 and 535. Each cache line 510, 520 and 530 includes plural respective data words 515, 525 and 535. The bit length of data words 515, 525 and 535 is set by the minimal addressable data amount of CPU 110. This is typically 8 bits/1 byte.

Cache 500 stores data from more distant memories such as external memory 131 which are accessed by a multi-bit address. Cache 500 is organized to facilitate this storage and to facilitate finding such data in the cache. Each cache line 510, 520 and 530 typically stores $2^N$ respective data words 515, 525 and 535, when N is an integer. The position of data words 515, 525 and 535 within the corresponding cache line 510, 520 and 530 along the dimension 501 serves as a proxy for the least significant bits of the address.

The position of cached data within lines along dimension 502 serves as a proxy for the next most significant bits of the address. The corresponding address tags 511, 521 and 531 form the remainder of the data word address. To determine if a memory access is to data cached within cache 500 (a cache hit), cache 500 compares the address tags for all cache lines to the most significant bits of the memory location accessed. Upon a detecting a match, the position within the cache line along dimension 501 corresponds to the least significant bits of the address permitting identification of the data word accessed.

Each data word 510, 520 and 530 includes a corresponding valid bit 512, 522 and 532. A first state of this valid bit indicates the corresponding data words 515, 525 or 535 are valid. An opposite state of this valid bit indicates the corresponding data words 515, 525 or 535 are not valid. There are several instances where data stored within cache 500 would not be valid. Upon initial activation of digital signal processor system 100 the L1I cache 121, L1D 123 cache and L2 cache 131 would not be loaded. Thus they would not store valid data. Accordingly, all cache lines are initially marked invalid. During a cache access a match of a requested address with address tags 511, 521 or 531 would not detect a match unless the corresponding valid bit 512, 522 or 532 indicated the data was valid.

Each data word 510, 520 and 530 includes a corresponding dirty bit 513, 523 and 533. A first state of this valid bit indicates the corresponding data words 515, 525 or 535 are dirty. An opposite state of this valid bit indicates the corresponding data words 515, 525 or 535 are not dirty (clean). Cache memory is generally used for both read accessed and write accesses. Upon a cache hit for a write access, the write data is written into the corresponding location within cache 500. According to the preferred writeback technique, this write data is not immediately forwarded to external memory 131. Instead the respective dirty bit 513, 523 or 533 is set to indicate dirty. A dirty indication means that there has been a write to the cached data not currently reflected in the base memory. According to the writeback technique this data is written to the base memory with the expectation that this writeback can accumulate plural writes to the memory location and nearby memory locations within the same cache line to reduce traffic on the bus to external memory 131.

The least recently used (LRU) bits 514, 524 and 534 are used when a cache line is replaced. Because the cache cannot hold all the data stored in the large, slow memory, the data within the cache must be replaced with new data regularly. Using a data words location within dimensions 501 and 502 as proxy for the least significant bits introduces a problem in locating data within cache 500. If there is only a single cache line having the same location on dimensions 501 and 502, then plural data from the large, slow memory will alias to the same cache line in cache 500. This is data having the same least significant address bits corresponding to dimensions 501 and 502 but differing most significant address bits. An access to such aliased data would require the previous data at that cache line to be replaced. This is considered disadvantageous. A typical prior art cache is set associative. Thus a set of cache lines have the same location on dimensions 501 and 502. Typical sets include two members (two-way set associative) or four members (four-way set associative). Each cache line of such a set is called a way. A cache miss to an address that aliases to one of these sets needs only to evict one of these ways. Determination of which way to evict is typically made based on prior usage of these ways. According to both the temporal and spatial locality principles more recently used cache ways are more likely to be reused than less recently used cache ways. LRU bits 514, 524 and 534 track accesses to cache ways within the set. When data is to be replaced the LRU bits indicate the least recently used way for replacement. Maintaining cache coherence requires writeback of a dirty way upon such replacement.

Figure 6:
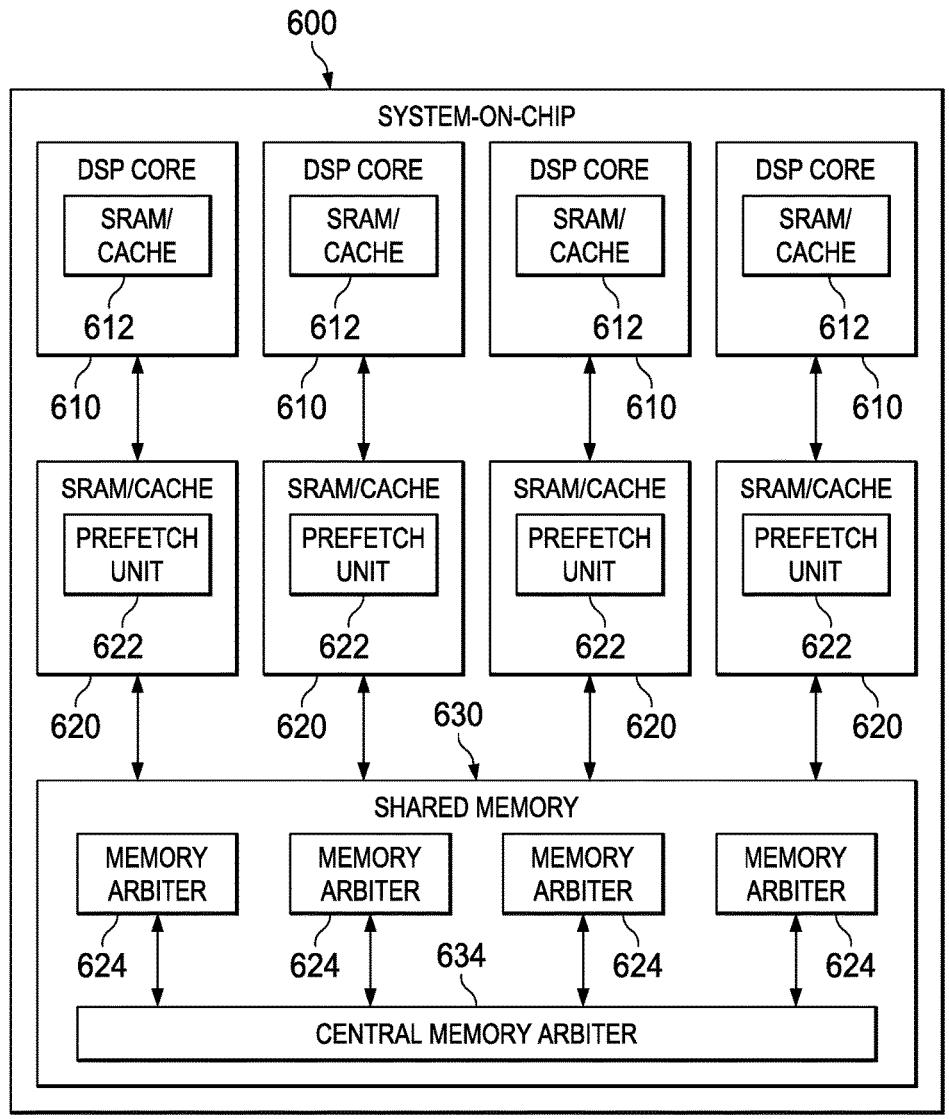
FIG. 6 illustrates a computing system including a local memory arbiter according to an embodiment of the invention.

FIG. 6 is a block diagram illustrating a computing system including a local memory arbiter according to an embodiment of the invention. FIG. 6 illustrates system on a chip (SoC) 600. SoC 600 includes one or more DSP cores 610, SRAM/Caches 620 and shared memory 630. SoC 600 is preferably formed on a common semiconductor substrate. These elements can also be implemented in separate substrates, circuit boards and packages. For example shared memory 630 could be implemented in a separate semiconductor substrate. FIG. 6 illustrates four DSP cores 610, but SoC 600 may include fewer or more DSP cores 610.

Each DSP core 610 preferably includes a level one data cache such as L1 SRAM/cache 612. In the preferred embodiment each L1 SRAM/cache 612 may be configured with selected amounts of memory directly accessible by the corresponding DSP core 610 (SRAM) and data cache. Each DSP core 610 has a corresponding level two combined cache L2 SRAM/cache 620. As with L1 SRAM/cache 612, each L2 SRAM/cache 620 is preferably configurable with selected amounts of directly accessible memory (SRAM) and data cache. Each L2 SRAM/cache 620 includes a prefetch unit 622. Each prefetch unit 622 prefetchs data for the corresponding L2 SRAM/cache 620 based upon anticipating the needs of the corresponding DSP core 610. Each DSP core 610 is further coupled to shared memory 630. Shared memory 630 is usually slower and typically less expensive memory than L2 SRAM/cache 620 or L1 SRAM/cache 610. Shared memory 630 typically stores program and data information shared between the DSP cores 610.

In various embodiments, each DSP core 610 includes a corresponding local memory arbiter 624 for reordering memory commands in accordance with a set of reordering rules. Each local memory arbiter 624 arbitrates and schedules memory requests from differing streams at a local level before sending the memory requests to central memory arbiter 634. A local memory arbiter 624 may arbitrate between more than one DSP core 610. Central memory arbiter 634 controls memory accesses for shared memory 630 that are generated by differing DSP cores 610 that do not share a common local memory arbiter 624.

Figure 7:
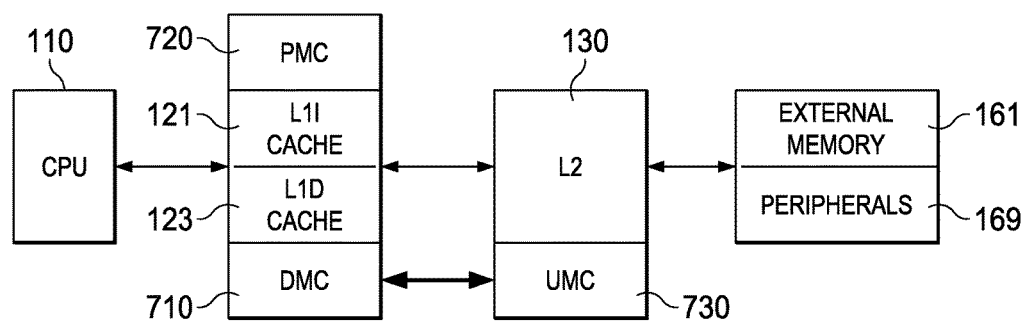
FIG. 7 is a further view of the digital signal processor system of this invention illustrating the various cache controllers.

FIG. 7 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 cache 130 is in turn bidirectionally connected to external memory 161 and peripherals 169. External memory 161 and peripherals 169 are shown together because they are at the same level in the memory hierarchy. Data transfers into and out of L1D cache 123 is are controlled by data memory controller (DMC) 710. Data transfers into and out of L1I cache 121 is are controlled by program memory controller (PMC) 720. Data transfers into and out of L2 130 including both cache and directly addressable memory (SRAM) are controlled by unified memory controller (UMC) 730.

Prior digital signal processors of the Texas Instruments TMS320C6000 family provided a coherency guarantee only for memory addresses that fall in the region designated as L2 SRAM. The coherence guarantee exists only between the L1D cache 123 and the portion of L2 cache 130 designated local SRAM. This coherence guarantee is necessary only because the L1D cache 123 and the L2 local SRAM can be independently accessed. Thus they must both have visibility into each other to always have access to the most up-to-date version of the data. These prior digital signal processors did not provide any coherence guarantees between caches in the multilevel cache hierarchy.

Figure 8:
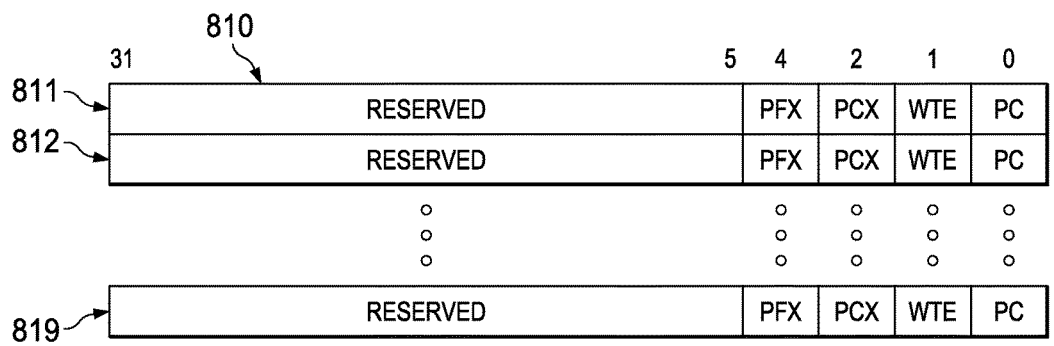
FIG. 8 illustrates the fields of a set of address attribute registers according to this invention.

In the data processing system of this invention regions of memory can be programmable marked as either write-through or write-back. FIG. 8 illustrates the fields of registers in a set of memory attribute registers 810 according to the preferred embodiment of this invention. The set of memory attribute 810 includes individual memory attribute registers 811, 812 . . . 819. Each of memory attribute registers 811, 812 . . . 819 corresponds to a predetermined region of memory. In the preferred embodiment memory is divided into 256 regions and the set of memory attribute registers 810 includes a corresponding one of memory attribute registers 811, 812 . . . 819 for each memory region. Thus each memory attribute registers 811, 812 . . . 819 the cache policy for addresses in the corresponding 16 MB address range. In the preferred embodiment with exception noted below memory attribute registers 811, 812 . . . 819 are CPU writable memory mapped control registers. In addition while the preferred embodiment provides a predetermined relationship between a memory attribute register and the corresponding memory address region this is not required. It is feasible for the memory address regions corresponding to each memory attribute register to be alterable. It is also feasible for the number of memory attribute registers to be variable. However, each memory write will have a single, identifiable memory attribute register controlling cache policy.

In each one of memory attribute registers 811, 812 . . . 819 the write through enable field (bit 1) determines the write-back or write-through policy for the corresponding memory region. This policy is listed in Table 2 below showing the coding of a write-through enable (WTE) bit.

TABLE 2

| WTE Bit | Cache Policy |
|---------|--------------|
| 0 | Write-back |
| 1 | Write-through |

Addresses in regions marked as write-through always update all levels of the memory hierarchy. Addresses corresponding to the L2 local SRAM are preferably hard-coded as write-back only in memory attribute register 801 corresponding to the first 16 MB the address space.

In the preferred embodiment the location of the set of memory attribute registers is divided between DMC 710 and UMC 730. The WTE bit for each register is physically stored in DMC 710. This information can pass to UMC 730 via interface control signals. In the preferred embodiment write-through is only enabled for external addresses and not for local memories such as shared memory 630. This allows the existing snoop-coherence protocol to continue to operate orthogonally, providing the user with two independent mechanisms for maintaining coherence between levels of the memory hierarchy. This flexibility allows the user to place shared memory that cannot tolerate delayed updates into regions marked as write-through. The L1D cache 123 and L2 SRAM coherence previously provided by the TMS320C6000 family is preserved. This hybrid cache policy solves the delayed update problem while preserving the behavior of the existing coherence mechanism.

Prior art techniques include uniform write-through, where write-through is applied to the entire cache hierarchy uniformly. In uniform write-through writes to a write-through memory address region are written through to all levels of the hierarchy regardless of address. Uniform write-through does not implement a cache coherence mechanism, because the different levels of the cache hierarchy are always coherent with one another.

Another prior art technique is cache-based write-through. In cache-based write-through a particular cache may designated as a write-through cache. Every write access to that specific cache is written through to the next level of the hierarchy, but not necessarily written through to all levels.

This invention divides the entire addressable memory range into regions that are independently designated as write-through or write-back. This invention provides the following advantages: it is flexible, programmable and fine grained control; and it works in concert with existing snoop-coherence mechanism to provide a dual-axis coherence approach based on address region. The ability to programmably mark regions of memory as write-through or write-back provides a significant amount of flexibility and control to the user. This capability is especially important in the embedded space, where memory is allocated and controlled very precisely.

What is claimed is:
1. A data processing method comprising the steps of:
   storing a plurality of memory attributes for a corresponding memory address range in a memory attribute reg- ister having plural entries, said memory attributes including a write-through enable (WTE) bit indicating a write-through or a write-back for said corresponding memory address range;

temporarily storing in a plurality of cache lines of a first data cache data for manipulation by said central processing unit;

temporarily storing in a plurality of cache lines in a second level memory including a second level cache data for manipulation by said central processing unit;

upon a central processing unit write to data cached in said first data cache
- writing said data in a corresponding cache line in said first data cache and passing said data on to write base memory if said write-through enable (WTE) bit of said memory attribute register entry for an address of said central processing unit write indicates write-through, and
- writing said data in a corresponding cache line in said first data cache and not passing said data on to write in base memory if said write-through enable (WTE) bit of said memory attribute register entry for an address of said central processing unit write indicates write-back; and upon a central processing unit write to data cached in said second level cache
- writing said data in a corresponding cache line in said second level cache if said write-through enable (WTE) bit of said memory attribute register entry for an address of said central processing unit write indicates write-through,
- writing said data in a corresponding cache line in said second level cache if said write-through enable (WTE) bit of said memory attribute register entry for an address of said central processing unit write indicates write-back and said data is not cached in said first data cache, and
- not writing said data in a corresponding cache line in said second level cache if said write-through enable (WTE) bit of said memory attribute register entry for an address of said central processing unit write indicates write-back and said data is cached in said first data cache; and locating said write-through enable (WTE) bit of each entry of said memory attribute register at a data memory controller for said first data cache; and locating at least one of said plurality of memory attributes of each entry of said memory attribute register at a unified memory controller for said second level memory.

2. The data processing method of claim 1, wherein:
said memory attribute register is a memory mapped control register writable by said central processing unit.

3. The data processing method of claim 1, further comprising the steps of:
disposing a second level local memory directly addressable by said central processing unit in said second level memory; and
fixing upon manufacture said write-through enable (WTE) bit in said memory attribute register for addresses of said second level local memory as indicating write-back.

\* \* \* \* \*